(12) United States Patent
Kwon

(10) Patent No.: US 9,685,574 B2
(45) Date of Patent: Jun. 20, 2017

(54) SOLAR CELL MODULE

(71) Applicant: LG INNOTEK CO., LTD., Seoul (KR)

(72) Inventor: Se Han Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 292 days.

(21) Appl. No.: 14/361,601

(22) PCT Filed: Nov. 27, 2012

(86) PCT No.: PCT/KR2012/010118
§ 371 (c)(1),
(2) Date: May 29, 2014

(87) PCT Pub. No.: WO2013/081354
PCT Pub. Date: Jun. 6, 2013

(65) Prior Publication Data
US 2014/0338727 A1  Nov. 20, 2014

(30) Foreign Application Priority Data

Nov. 29, 2011 (KR) .................... 10-2011-0126249

(51) Int. Cl.
*H01L 31/052* (2014.01)

(52) U.S. Cl.
CPC .......... *H01L 31/0521* (2013.01); *Y02E 10/50* (2013.01)

(58) Field of Classification Search
None
See application file for complete search history.

(56) References Cited

U.S. PATENT DOCUMENTS

| 7,235,736 | B1 * | 6/2007 | Buller ............... H01L 31/03528 136/246 |
| 2004/0221886 | A1 | 11/2004 | Oono et al. |
| 2004/0237960 | A1 | 12/2004 | Liu et al. |
| 2006/0124167 | A1 | 6/2006 | Fan et al. |
| 2010/0108118 | A1 * | 5/2010 | Luch ..................... F24J 2/525 136/244 |

FOREIGN PATENT DOCUMENTS

| CN | 101409310 A | 4/2009 |
| CN | 101436619 A | 5/2009 |
| DE | 10048032 C1 | 5/2002 |
| KR | 100867655 B1 | 11/2008 |
| WO | WO-2006-102891 A2 | 10/2006 |
| WO | WO-2011-132211 A1 | 10/2011 |

OTHER PUBLICATIONS

Office Action dated Mar. 4, 2016 in Chinese Application No. 201280068450.3.
International Search Report in International Application No. PCT/KR2012/010118, filed Nov. 27, 2012.
Office Action dated Nov. 2, 2016 in Chinese Application No. 201280068450.3.

* cited by examiner

*Primary Examiner* — Magali P Slawski
(74) *Attorney, Agent, or Firm* — Saliwanchik, Lloyd & Eisenschenk

(57) ABSTRACT

Disclosed is a solar cell module. The solar cell module includes a solar cell panel including a plurality of solar cells; a protective substrate on the solar cell panel; and a ventilation unit for ventilating the solar cell panel.

9 Claims, 2 Drawing Sheets

SOLAR CELL MODULE

CROSS-REFERENCE TO RELATED APPLICATIONS

This application is the U.S. national stage application of International Patent Application No. PCT/KR2012/010118, filed Nov. 27, 2012, which claims priority to Korean Application No. 10-2011-0126249, filed Nov. 29, 2011, the disclosures of each of which are incorporated herein by reference in their entirety.

TECHNICAL FIELD

The embodiment relates to a solar cell module.

BACKGROUND ART

A solar cell module to convert light energy into electrical energy through photo-electric conversion effect has been extensively used as a device to obtain non-pollution energy contributing to the conservation of global environment.

As the photoelectric conversion effect of a solar cell is improved, a great number of solar cell systems having a solar cell module are installed even for home use.

In order to output power generated from the solar cell module including solar cells that generate power from the light of the sun to the outside, conductors acting as positive and negative electrodes are provided in the solar cell module, and terminals of the conductors, which serve as connectors connected to a cable of outputting current to the outside, are withdrawn out of a photovoltaic module.

In a case of a Building-Integrated Photovoltaic System (BIPV) used to substitute for a transparent glass of a building, heat may be generated due to a space between integrated structures. The durability of the solar cell module may be reduced and the solar cell module may be damaged under the high-temperature environment. Therefore, the reliability of the solar cell module is lowered.

DISCLOSURE OF INVENTION

Technical Problem

The embodiment provides a solar cell module having improved reliability.

Solution to Problem

According to the embodiment, there is provided a solar cell module including a solar cell panel including a plurality of solar cells; a protective substrate on the solar cell panel; and a ventilation unit for ventilating the solar cell panel.

Advantageous Effects of Invention

As described above, the solar cell module according to the embodiment includes the ventilation unit for ventilating the solar cell panel. Air is circulated through the ventilation unit, so that the heat generated from the solar cell module may be readily exhausted. Thus, the damage to the solar cell module due to the high temperature may be prevented, so that the durability of the solar cell module may extend. Therefore, the reliability of the solar cell module may be improved.

MODE FOR THE INVENTION

Figure 1:
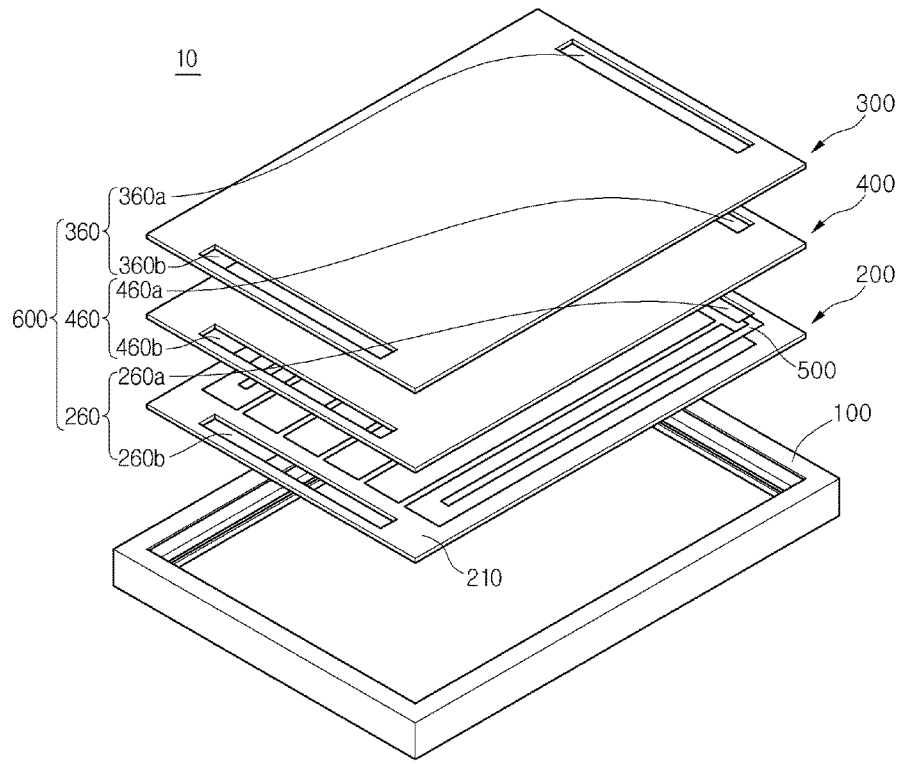
FIG. 1 is an exploded perspective view showing a solar cell module according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of the layer (or film), the region, the pattern, or the structure does not utterly reflect an actual size.

Hereinafter, the embodiment will be described with reference to accompanying drawings in detail.

First, the solar cell module according to the first embodiment will be described in detail with reference to FIGS. 1 to 3.

FIG. 1 is an exploded perspective view showing a solar cell module according to the first embodiment. FIG. 2 is a perspective view showing the solar cell module according to the first embodiment. FIG. 3 is a perspective view showing a solar cell panel included in the solar cell module according to the first embodiment.

Figure 2:
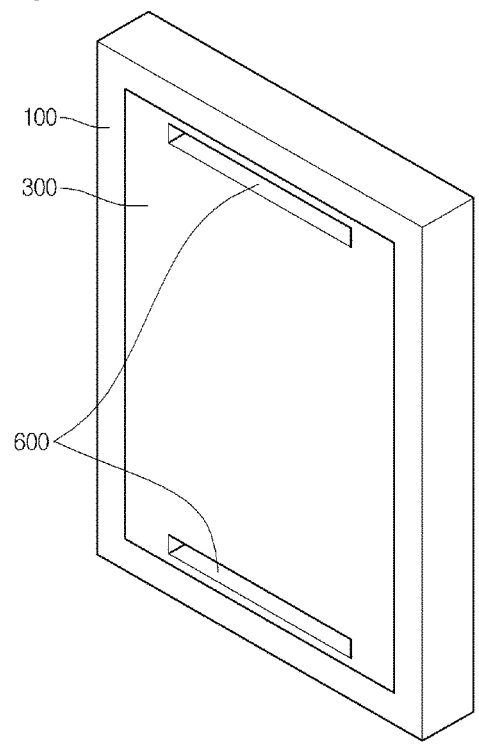
FIG. 2 is a perspective view showing the solar cell module according to the first embodiment.
Figure 3:
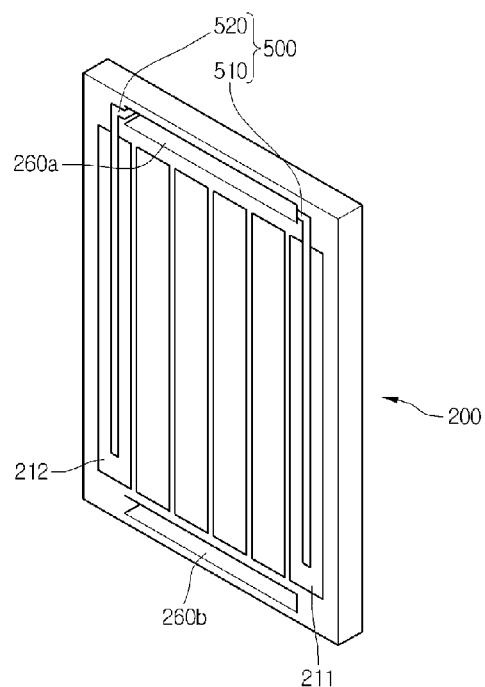
FIG. 3 is a perspective view showing a solar cell panel included in the solar cell module according to the first embodiment.

Referring to FIGS. 1 to 3, the solar cell module 10 according to the first embodiment includes a frame 100, a solar cell panel 200, a protective substrate 300, a buffer sheet 400, and a ventilation unit 600.

The frame 100 is disposed on a side surface of the solar cell panel 200. The frame 100 accommodates the solar cell panel 200, the protective substrate 300 and the buffer sheet 400 therein. In detail, the frame 100 surrounds the side surface of the solar cell panel 200.

For example, the frame 100 may be a metal frame 100. In addition, the frame 100 may include aluminum, stainless steel or steel.

The solar cell panel 200 is disposed inside the frame 100. The solar cell panel 200 has a plate shape and includes a plurality of solar cells.

For example, the solar cells 210 may include a CIGS-based solar cell, a silicon-based solar cell, a dye-sensitized solar cell, a group II-VI compound semiconductor solar cell, or a group III-V compound semiconductor solar cell.

In addition, the solar cells 210 may be disposed on a transparent substrate such as a glass substrate.

The solar cells 210 may be arranged in the shape of a stripe. In addition, the solar cells 210 may be arranged in various shapes such as a matrix shape.

The protective substrate 300 is disposed over the solar cell panel 200. The protective substrate 300 is provided in opposition to the solar cell panel 200.

The protective substrate 300 may be transparent and have a high strength. The material constituting the protective substrate 300 may include tempered glass.

The buffer sheet 400 is interposed between the protective substrate 300 and the solar cell panel 200. The buffer sheet 400 protects the solar cell panel 200 from the external physical shock. In addition, the buffer sheet 400 prevents the protective substrate 300 from colliding with the solar cell panel 200.

The buffer sheet 400 may perform an anti-reflective function so that a greater amount of light is incident onto the solar cell panel 200.

The material constituting the buffer sheet 400 may include ethylene vinyl acetate (EVA) resin.

The protective substrate 300 and the buffer sheet 400 are disposed inside the frame 100. In detail, the side surfaces of the solar cell panel 200, the protective substrate 300 and the buffer sheet 400 are inserted into and fixed to the frame 100.

The bus bar 500 is disposed on the solar cell panel 200. The bus bar 500 makes contact with the top surfaces of two of the solar cells 210, and is electrically connected to the solar cells 210.

For example, referring to FIG. 3, the bus bar 500 includes a first bus bar 510 and a second bus bar 520.

The first bus bar 510 makes contact with a top surface of one outermost solar cell 211 of the solar cells 210 and the second bus bar 520 makes direct contact with the top surface of the other outermost solar cell 212 of the solar cells 210.

The bus bar 500 may include a conductor, and may include copper (Cu).

Meanwhile, the ventilation of the solar cell panel 200 is achieved through the ventilation unit 600. The ventilation unit 600 may include a panel opening 260, a protective substrate opening 360 and a buffer sheet opening 460.

The panel opening 260 is located at an edge of the solar cell panel 200. The panel opening 260 includes a first panel opening 260a and a second panel opening 260b.

The first panel opening 260a is located at one side of the edge of the solar cell panel 200. The second panel opening 260b is located at another side facing the one side. That is, the first panel opening 260a and the second panel opening 260b may face each other.

The protective substrate opening 360 is located at an edge of the protective substrate 300. The protective substrate opening 360 includes a first protective substrate opening 360a and a second protective substrate opening 360b.

The first protective substrate opening 360a is located at one side of the edge of the protective substrate 300. The second protective substrate opening 360b is located at another side facing the one side. That is, the first protective substrate opening 360a and the second protective substrate opening 360b may face each other.

The buffer sheet opening 460 is located at an edge of the buffer sheet 400. The buffer sheet opening 460 includes a first buffer sheet opening 460a and a second buffer sheet opening 460b.

The first buffer sheet opening 460a is located at one side of the edge of the buffer sheet 400. The second buffer sheet opening 460b is located at another side facing the one side.

The panel opening 260 corresponds to the protective opening 360. The buffer sheet opening 460 corresponds to the panel opening 260 and the protective opening 360. In detail, the first panel opening 260a, the first protective substrate opening 360a and the first buffer sheet opening 460a correspond to each other. The second panel opening 260b, the second protective substrate opening 360b and the second buffer sheet opening 460b correspond to each other.

Referring to FIG. 3, the end of the bus bar 500 may pass through the panel opening 260. In detail, the end of the bus bar 500 may pass through the first panel opening 260a. The bus bar 500 is electrically connected to a cable (not shown) through the panel opening 260. In other words, the cable transfers electrical energy generated from the solar cell panel 200 to a rectifier and/or a battery. A terminal box, such as a junction box, for connecting the cable to the bus bar 500 may be provided on the back surface of solar cell panel 200.

The ventilation unit 600 may be formed by using a tool such as a drill when the solar cell module is formed.

Air may be circulated through the ventilation unit 600 and heat generated from the solar cell module may be readily exhausted through the ventilation unit 600. Thus, damage to the solar cell module due to the high temperature may be prevented so that the durability of the solar cell module may extend. Therefore, the reliability of the solar cell module may be improved.

Since the ventilation unit 600 is provided in the solar cell module, the ventilation unit 600 may be formed through a simple process.

Hereinafter, the solar cell module according to the second embodiment will be described with reference to FIG. 4. In the following description, the details of structures and components the same as those of the first embodiment or extremely similar to those of the first embodiment will be omitted except for only structures and components making the difference from those of the first embodiment for the purpose of clear and simple explanation.

Figure 4:
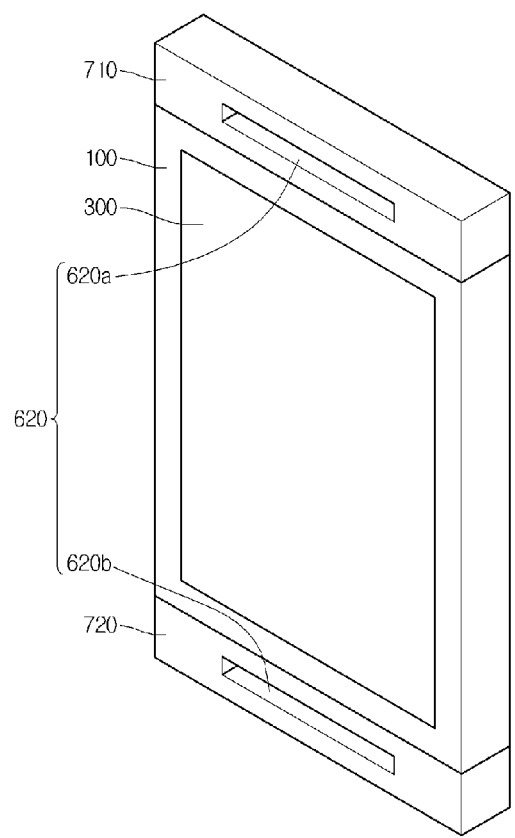
FIG. 4 is a perspective view showing a solar cell module according to the second embodiment.

FIG. 4 is a perspective view showing a solar cell module according to the second embodiment.

Referring to FIG. 4, the solar cell module 20 according to the second embodiment includes a ventilation unit 620. The ventilation unit 620 includes a first ventilation portion 620a and a second ventilation portion 620b.

The first ventilation portion 620a is located at one side of the solar cell panel. The first ventilation portion 620a may be provided at a separate structure 710.

The second ventilation portion 620b is located at the other side in opposite to the one side. The second ventilation portion 620b may be provided at another separate structure 720.

In detail, the ventilation unit 620 may be located at the upper and lower portions of the solar cell panel. That is, the ventilation unit 620 may be separately provided at the solar cell panel.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a solar cell panel including a plurality of solar cells;
a protective substrate on the solar cell panel;
a frame surrounding side surfaces of the solar cell panel and the protective substrate; and
a ventilation unit for ventilating the solar cell panel,
wherein the ventilation unit comprises:
a panel opening located at an edge of the solar cell panel and formed therethrough from a bottom surface to a top surface of the solar cell panel; and
a protective substrate opening located at an edge of the protective substrate, formed therethrough from a bottom surface to a top surface of the protective substrate, and corresponding in position to the panel opening;
wherein the solar cell module further comprises: a bus bar connected to one of the solar cells and disposed on the solar cell panel, wherein an end of the bus bar passes through the panel opening.

2. The solar cell module of claim 1, wherein the panel opening includes a first panel opening located at one side in the edge of the solar cell panel and a second panel opening located at another side opposite from the one side.

3. The solar cell module of claim 2, wherein the protective substrate opening includes a first protective substrate opening located at one side in the edge of the protective substrate and a second protective substrate opening located at another side opposite from the one side.

4. The solar cell module of claim 3, further comprising:
a buffer sheet between the solar cell panel and the protective substrate,
wherein the ventilation unit further includes a buffer sheet opening located at an edge of the buffer sheet.

5. The solar cell module of claim 4, wherein the buffer sheet opening corresponds in position to the panel opening and the protective substrate opening.

6. The solar cell module of claim 4, wherein the buffer sheet opening includes a first buffer sheet opening located at one side in the edge of the buffer sheet and a second buffer sheet opening located at another side opposite from the one side.

7. The solar cell module of claim 6, wherein the first panel opening, the first protective substrate opening and the first buffer sheet opening correspond in position to each other.

8. The solar cell module of claim 6, wherein the second panel opening, the second protective substrate opening and the second buffer sheet opening correspond to each other.

9. The solar cell module of claim 1, wherein the ventilation unit includes a first ventilation portion located at one side of the solar cell panel and a second ventilation portion located at another side opposite from the one side.

* * * * *